US012486563B2

(12) United States Patent
Chen et al.

(10) Patent No.: US 12,486,563 B2
(45) **Date of Patent: *Dec. 2, 2025**

(54) SPUTTERING TARGET

(71) Applicants: Plansee Shanghai High Performance Material Ltd., Shanghai (CN); Plansee SE, Reutte (AT); Plansee Japan Ltd., Tokyo (JP)

(72) Inventors: Chao Chen, Shanghai (CN); Jiandong Lu, Shanghai (CN); Christian Linke, Reutte (AT); Tsutomu Kuniya, Kanagawa (JP); Hennrik Schmidt, Reutte (AT)

(73) Assignees: Plansee Shanghai High Performance Material Ltd., Shanghai (CN); Plansee SE, Reutte (AT); Plansee Japan Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/692,916

(22) PCT Filed: Sep. 16, 2022

(86) PCT No.: PCT/CN2022/119248

§ 371 (c)(1),
(2) Date: Mar. 18, 2024

(87) PCT Pub. No.: WO2023/041018

PCT Pub. Date: Mar. 23, 2023

(65) Prior Publication Data

US 2024/0337008 A1 Oct. 10, 2024

(30) Foreign Application Priority Data

Sep. 16, 2021 (CN) ........................ 202122247144.5

(51) Int. Cl.
*C23C 14/34* (2006.01)

(52) U.S. Cl.
CPC ................................ *C23C 14/3407* (2013.01)

(58) Field of Classification Search
CPC ................................................ C23C 14/3407
See application file for complete search history.

(56) References Cited

U.S. PATENT DOCUMENTS 8,845,868 B2 * 9/2014 Newcomb ............. F16J 15/062 204/298.22
2002/0096430 A1 * 7/2002 Lupton ................ H01J 37/342 204/192.1

(Continued)

FOREIGN PATENT DOCUMENTS

CN 201670870 U 12/2010
CN 215713338 U 2/2022

(Continued)

OTHER PUBLICATIONS

JP-5283354-B2 Translation (Year: 2013).*
WO-2016067717-A1 Translation (Year: 2016).*

*Primary Examiner* — Patrick S Ott
(74) *Attorney, Agent, or Firm* — Laurence A. Greenberg; Werner H. Stemer; Ralph E. Locher

(57) ABSTRACT

A sputtering target includes a tubular backing tube which has an axis which is defined as an axial direction, and a plane in which a radial direction lies is perpendicular to the axial direction. A cylindrical target segment is arranged on the tubular backing tube extends along the axial direction through at least 90% of length of the cylindrical target segment. A bonding material is arranged between the tubular backing tube and the target segment. The sputtering target includes a stop member for a target segment adjacent to the stop member, the stop member is monolithically formed with and radially protruding along the tubular backing tube at an axial end region of the tubular backing tube and extending along a part of a circumference of the tubular (Continued)

backing tube. A circumferential sealing member is inserted between the stop member and the target segment to prevent leakage of the bonding material.

8 Claims, 2 Drawing Sheets

(56) References Cited

U.S. PATENT DOCUMENTS

| | | | | |
|---|---|---|---|---|
| 2003/0136662 | A1* | 7/2003 | Ueda | H01J 37/3491 204/298.22 |
| 2010/0326823 | A1* | 12/2010 | Todoko | C23C 14/3407 204/298.13 |
| 2011/0031117 | A1* | 2/2011 | Kim | C23C 14/3464 204/298.12 |
| 2011/0220489 | A1 | 9/2011 | Lippert et al. | |
| 2014/0021044 | A1* | 1/2014 | Simpson | H01J 37/3491 204/298.12 |
| 2014/0110245 | A1* | 4/2014 | Gossman | C23C 14/3407 204/192.12 |
| 2014/0124365 | A1 | 5/2014 | Wurczinger et al. | |

FOREIGN PATENT DOCUMENTS

| | | | | |
|---|---|---|---|---|
| JP | 5283354 B2 * | 9/2013 | | C23C 14/086 |
| KR | 20080012549 A | 2/2008 | | |
| WO | 2014131458 A1 | 9/2014 | | |
| WO | WO-2016067717 A1 * | 5/2016 | | C04B 37/02 |

* cited by examiner

SPUTTERING TARGET

FIELD AND BACKGROUND OF THE INVENTION

The present application relates to a sputtering target.

Sputtering is a physical vapor deposition technique that refers to the physical process in which atoms in a solid target are bombarded by energetic ions (usually from a plasma) and ejected from the solid into a gas. Sputtering is generally performed in a vacuum system filled with an inert gas. Under the action of a high-voltage electric field, an argon gas is ionized to generate an argon ion flow, which bombards the target cathode. The sputtered target material atoms or molecules are deposited on the semiconductor chip, glass, or ceramic to form a thin film. Sputtering has the advantages of being capable of producing thin films of high melting point materials at lower temperatures, and maintaining the original composition during the process of producing thin films of alloys and compounds. Therefore, sputtering has been widely used in the manufacture of semiconductor devices and integrated circuits.

Sputtering target materials are materials that produce thin films by sputtering and are manufactured from metals and ceramics. In recent years, there have been demands for further lower power consumption and higher speed of electronic components, and in order to achieve these demands, various high-quality sputtering target materials are required.

Generally, the sputtering target material is mainly composed of a target blank, backing plate, and other parts. The target blank is a target material bombarded by a high-speed ion beam current and belongs to a core part of the sputtering target material. In the sputtering coating process, after the target blank is hit by ions, surface atoms thereof are sputtered, scattered out, and deposited on a substrate to make an electronic film. Due to a lower strength of the high-purity metal, the sputtering target material needs to be installed in a special machine to complete the sputtering process. The inside of the machine is a high-voltage and high-vacuum environment. Therefore, the sputtering target blank of the ultra-high-purity metal needs to be joined with the backing plate through a different welding process. The backing plate mainly plays the role of fixing the sputtering target material, and needs to have good electrical and thermal conductivity.

In the prior art, a tubular target material is provided. The tubular target material includes a tubular target body having recesses, and two connecting members having flanges that engage the recesses. The connecting member has a depression in which a solder is present to connect the tubular target body to the connecting members. However, with this target material, as the temperature rises, the solder tends to leak from a lowermost end of the target material.

In the prior art, a target material assembly and a target material unit are further provided. The target material assembly includes a plurality of target material units and a plurality of joining parts. Each of the plurality of target material units possesses a cylindrical target material and a cylindrical base. The cylindrical base is engaged inside the cylindrical target material. The joining part is positioned inside a plurality of target material units, and each of the plurality of target material units includes a gap therebetween. However, with this target material, as the temperature rises, the solder is also easy to leak from the lowermost end of the target material.

In the prior art, a target mounting mechanism is further provided. The target mounting mechanism is mounted with a cylindrical target including a cylindrical support tube and a target material covering the support tube, and including a joining region, the target being connected to a clamp. However, with this target material, as the temperature rises, the solder is also easy to leak from the lowermost end of the target material.

In the prior art, an interlocking cylindrical magnetron cathode and a target material are further provided. The magnetron assembly includes a first unit which allows the target material to be removed from the cathode body. However, with this target material, as the temperature rises, the solder is also easy to leak from the lowermost end of the target material.

In the prior art, a tubular target is further provided. The tubular target is composed of a support tube and a sputtering material tube. The support tube is connected to the sputtering material tube by a threaded connection. An O-ring seal is arranged between the support tube and the sputtering material tube. However, with this target material, as the temperature rises, the solder is also easy to leak from the lowermost end of the target material.

It can be seen from the above that it becomes a difficult problem in technics most in need of a solution by those skilled in the art so that an improved sputtering target can be provided in view of the deficiencies in the prior art. The said sputtering target is capable of preventing the leakage of the solder from the lowermost end of the target material, significantly improve the assembly accuracy and assembly stability, and achieve stable quality, high yield rate, and cost savings.

SUMMARY OF THE INVENTION

Problem to be Solved

It is an object of the present application to overcome the drawbacks of the prior art and to provide a sputtering target. According to the sputtering target provided in the present application, stable quality, high yield rate and cost savings are achieved.

Method for Solving the Problem

A first aspect of the present application relates to a sputtering target for producing a thin film by a sputtering method. The sputtering target includes:

- a tubular backing tube, of which an axis being defined as an axial direction, and a plane in which a radial direction lies being perpendicular to the axial direction;
- at least one cylindrical target segment arranged on the tubular backing tube extending along the axial direction through at least 90% of a total length of the at least one cylindrical target segment;
- a bonding material arranged between the tubular backing tube and the cylindrical target segment;
- a stop member for the target segment adjacent to the stop member, the stop member being monolithically (or integrally) formed with and radially protruding along the tubular backing tube at an axial end region of the tubular backing tube and extending at least along a part of a circumference of the tubular backing tube; and
- a circumferential sealing member inserted between the stop member and the adjacent target segment to prevent leakage of the bonding material.

In some embodiments, the stop member extends continuously along the circumference of the tubular backing tube.

In some embodiments, the stop member is a protruding step part.

In some embodiments, the protruding step part is a protruding ridge with two parallel side walls.

In some embodiments, the sealing member is an O-ring made of an elastomeric material and compressed between the target segment and the stop member.

In some embodiments, the stop member has a circumferential member with a radially protruding lip pressed against the stop member and/or the target segment to provide a sealing function.

In some embodiments, the stop member is a monolithic part of the tubular backing tube.

In some embodiments, the stop member and the adjacent target segment form a tongue-groove-fit.

In some embodiments, the target segment is made of a metallic material.

In some embodiments, the metallic material is a molybdenum- and/or tungsten-based material.

In some embodiments, the bonding material is a solder.

In some embodiments, the solder is an indium solder or an indium alloy solder.

In some embodiments, the sputtering target further includes at least two cylindrical target segments juxtaposed along the axial direction on the tubular backing tube, wherein at least two ends of the at least two cylindrical target segments facing each other form a tongue-groove-fit with each other in such a way that at least one tongue at one end is overlapped with at least one groove at a corresponding other end of two adjacent cylindrical target segments, as viewed in the radial and/or the axial direction, the overlap extending at least along a part of a circumference of the corresponding end.

Effects

According to the sputtering target of the present application, leakage of the solder from the lowermost end of the target material is prevented, assembly accuracy and assembly stability are significantly improved, and stable quality, high yield rate, and cost savings are achieved.

DETAILED DESCRIPTION OF THE INVENTION

The technical solutions according to the present application are clearly and completely described below with reference to the accompanying drawings, and it is obvious that the described embodiments are a part of the embodiments of the present application, rather than all the embodiments. Based on the embodiments in the present application, all the other embodiments obtained by those skilled in the art without making any inventive effort fall within the scope of protection of the present application.

In the description of the present application, it should be noted that the orientation or positional relationships indicated by the terms "center", "upper", "lower", "top", "bottom", "inner", "outer", and the like, are based on the orientation or positional relationships shown in the accompanying drawings, which are only for the convenience of describing the present application and simplifying the description, rather than indicating or implying that the referenced devices or elements must have a particular orientation, be constructed and operated in a particular orientation, and thus should not be construed as limiting the application.

In the description of the present invention, it should be noted that, unless expressly stated or limited otherwise, the terms "arrange", "connect", and "joint" are to be interpreted broadly and may, for example, be fixedly connected, detachably connected, or monolithically (or integrally) connected. The specific meaning of the above terms in the present application can be understood in detail by those skilled in the art.

In addition, the technical features involved in the different embodiments of the present application described below can be combined with each other as long as they do not conflict with each other.

Figure 1:
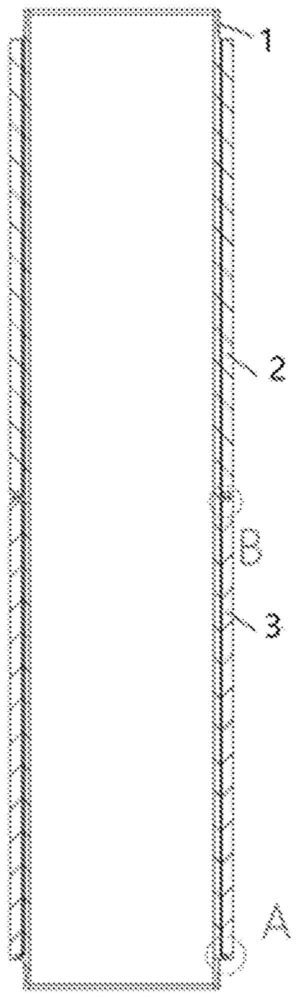
FIG. 1 is a schematic illustration of a sputtering target according to a first embodiment of the present application.

FIG. 1 is a schematic illustration of a sputtering target according to a first embodiment of the present application. As shown in FIG. 1, the sputtering target includes a tubular backing tube 1 and cylindrical target segments 2 and 3. The number of the target segments is not limited to two, but may be three or more. An axis of the backing tube 1 is defined as an axial direction (a top-bottom direction in FIG. 1). A plane in which a radial direction (a left-right direction in FIG. 1) of the backing tube 1 lies is perpendicular to the axial direction. The cylindrical target segments 2 and 3 are arranged on the backing tube 1 which extends along the axial direction through a total length of the target segments 2 and 3. In some embodiments, the target segments 2 and 3 are made of a metallic material, for example a molybdenum- and/or tungsten-based material. A bonding material is arranged between the backing tube 1 and the target segments 2 and 3. In some embodiments, the bonding material is a solder, such as an indium solder or an indium alloy solder. A stop member is arranged at a lower side (site A in FIG. 1) of the target segment 3.

Figure 2:
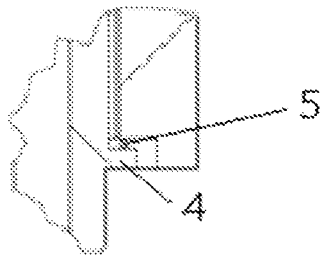
FIG. 2 is an enlarged partial view at site A in the sputtering target of FIG. 1.

FIG. 2 is an enlarged partial view at site A in FIG. 1. As shown in FIG. 2, the stop member 4 is formed monolithically (or integrally) with and protrudes radially along the backing tube 1 at an axial end region of the backing tube 1 and extends at least along a part of a circumference of the backing tube 1. That is, the stop member 4 is a monolithic part of the backing tube 1, and the stop member 4 and the adjacent target segment 3 form a tongue-groove-fit. "Monolithically formed" (or "integrally formed") shall include forming in one step from the same material or joining by welding, gluing, etc. A circumferential sealing member 5 preventing leakage of the bonding material is inserted between the stop member 4 and the target segment 3. In some embodiments, the stop member 4 extends continuously along the circumference of the backing tube 1. In some embodiments, the sealing member 5 is an O-ring made of an elastomeric material and compressed between the target segment 3 and the stop member 4, but not limited thereto. Other suitable structures may also be employed.

In some embodiments, the stop member 4 is a protruding step part, but is not limited thereto. Other suitable structures may also be employed. The protruding step part may be a protruding ridge with two parallel side walls, including a substantially rectangular cross-section with two parallel side walls, but is not limited thereto. Other suitable structures may also be employed, such as a step part with a tapered or conical cross-section and a corresponding tapered or conical groove.

In some embodiments, the stop member 4 has a circumferential member with a radially protruding lip pressed against the stop member 4 and/or the target segment 3 to provide a sealing function, but is not limited thereto. Other suitable structures may also be employed. That is, a circumferential seal member extends circumferentially along the gap between two adjacent target segments, such as a lip, a T-profile, a foil, and an annular metal piece with a spring function.

In some embodiments, the stop member 4 includes, for example, a groove, or tongue extending along the axial direction, but is not limited thereto. Other suitable structures may also be employed.

Figure 3:
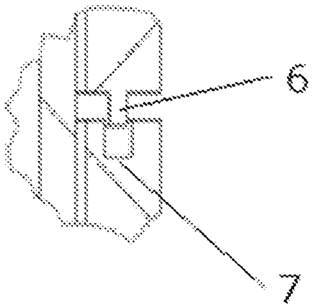
FIG. 3 is an enlarged partial view at site B in the sputtering target of FIG. 1.

FIG. 3 is an enlarged partial view at site B in FIG. 1. As shown in FIG. 3, the two ends of the target segments 2 and 3 facing each other form a tongue-groove-fit with each other in such a way that one tongue 6 at an end of the target segment 2 is overlapped with one groove 7 at the corresponding other end of the target segment 3, as viewed in the radial and/or axial direction, the overlap extending along a part of a circumference of the corresponding end.

Existing sputtering target materials are generally planar joints where multiple target segments are spliced together, and there is no fixed target material boss on the surface of the backing tube. Compared with the existing cutting method, the sputtering target according to the present application includes a monolithically (or integrally) formed stop member, and further includes a sealing member, which significantly improves assembly accuracy and assembly stability. During the application process of the target material, as the temperature rises, the solder is also prevented from leaking from a lowermost end of the target material.

Hereinafter, suitable examples of the present application are described, but the embodiments of the present application are not limited thereto.

Example 1

The sputtering target in Example 1 includes a tubular backing tube 1, cylindrical target segments 2 and 3 made of molybdenum, a stop member 4, and a sealing member 5. The target segments 2 and 3 are arranged on the backing tube 1, and the backing tube 1 extends along the axial direction through a total length of the target segments 2 and 3. Indium solder is arranged between the backing tube 1 and the target segments 2 and 3. A stop member 4 is arranged at the target segment 3. The stop member 4 is formed monolithically (or integrally) with the backing tube 1 in the axial end region of the backing tube 1 using the same material as the backing tube 1 and protrudes radially along the backing tube 1 and extends continuously along a circumference of the backing tube 1. The stop member 4 is a protruding step part, having protruding ridge with two parallel side walls, including a substantially rectangular cross-section with two parallel side walls. After the sputtering target of the present application is applied, the leakage of solder from a lowermost end of the target material is prevented, the assembly precision and assembly stability are significantly improved, and the production efficiency is greatly improved.

Example 2

The sputtering target in Example 2 includes a tubular backing tube 1, cylindrical target segments 2 and 3 made of tungsten, a stop member 4, and a sealing member 5. The target segments 2 and 3 are arranged on the backing tube 1, and the backing tube 1 extends along the axial direction through an entire total length of the target segments 2 and 3. A plurality of target segments may also be arranged between the target segments 2 and 3. An indium alloy solder is arranged between the backing tube 1 and the target segments 2 and 3. A stop member 4 is arranged at the target segment 3. The stop member 4 is formed monolithically (or integrally) with the backing tube 1 in an axial end region of the backing tube 1 in such a manner as to be welded and radially protrudes along the backing tube 1, and extends continuously along a circumference of the backing tube 1. The stop member 4 has a circumferential member with a radially protruding lip pressed against the stop member 4 and/or the target segment 3 to provide a sealing function. By applying the sputtering target of the present application, the leakage of the solder from a lowermost end of the target material is prevented, the assembly precision and assembly stability are significantly improved, and the production efficiency is greatly improved.

Example 3

The sputtering target in Example 3 includes a tubular backing tube 1, cylindrical target segments 2 and 3 made of tantalum, a stop member 4, and a sealing member 5. The target segments 2 and 3 are arranged on the backing tube 1, and the backing tube 1 extends along the axial direction through a total length of the target segments 2 and 3. A plurality of target segments may also be arranged between the target segments 2 and 3. An indium alloy solder is arranged between the backing tube 1 and the target segments 2 and 3. A stop member 4 is arranged at the target segment 3. The stop member 4 is formed monolithically (or integrally) with the backing tube 1 in an axial end region of the backing tube 1 in such a manner as to be connected with glue and radially protrudes along the backing tube 1, and extends continuously along a circumference of the backing tube 1. The stop member 4 is an annular metal piece having a spring function. By applying the sputtering target of the present application, the leakage of the solder from a lowermost end of the target material is prevented, the assembly precision and assembly stability are significantly improved, and the production efficiency is greatly improved.

INDUSTRIAL APPLICABILITY

According to the sputtering target involved in the present application, the problem caused by easy leakage of the solder from the lowermost end of the target material during the application of the target material along with the temperature rising has been effectively solved, and stable quality, high yield rate and cost savings have also been achieved.

While the present application has been described with reference to the preferred embodiments thereof, it will be understood by those skilled in the art that various changes may be made and equivalents may be substituted for elements thereof without departing from the scope of the present application. Therefore, the scope of the present application should be subject to the protection scope of the claims.

What is claimed is:

1. A sputtering target for producing a thin film by a sputtering method, the sputtering target comprising:

a tubular backing tube having an axis defining an axial direction, and a radial direction plane perpendicular to the axial direction;

at least one cylindrical target segment disposed on said tubular backing tube, said tubular backing tube extending along the axial direction through at least 90% of a total length of said at least one cylindrical target segment;

a bonding material disposed between said tubular backing tube and said at least one cylindrical target segment, said bonding material being solder;

a stop member, said at least one cylindrical target segment disposed adjacent said stop member, said stop member being monolithically formed with and radially protruding along said tubular backing tube at an axial end region of said tubular backing tube, and extending at least along a part of a circumference of said tubular backing tube;

a circumferential sealing member, said at least one cylindrical target segment including an adjacent cylindrical target segment being adjacent said circumferential sealing member, said circumferential sealing member inserted between said stop member and said adjacent cylindrical target segment to prevent leakage of said bonding material;

said circumferential sealing member being an O-ring made of an elastomeric material and compressed between said adjacent cylindrical target segment and said stop member;

said stop member and said adjacent cylindrical target segment forming a tongue-groove-fit;

said at least one cylindrical target segment made of a metallic material being a molybdenum-based and/or tungsten-based material; and said solder being an indium solder or an indium alloy solder.

2. The sputtering target according to claim 1, wherein said stop member extends continuously along the circumference of said tubular backing tube.

3. The sputtering target according to claim 1, wherein said stop member is a protruding step part.

4. The sputtering target according to claim 3, wherein said protruding step part is a protruding ridge with two parallel side walls.

5. The sputtering target according to claim 1, wherein said stop member has a circumferential member radially protruding and pressed against said at least one cylindrical target segment to provide a sealing function.

6. The sputtering target according to claim 1, wherein said stop member is a monolithic part of said tubular backing tube.

7. The sputtering target according to claim 1, wherein:

said at least one cylindrical target segment is one of at least two cylindrical target segments juxtaposed along the axial direction on said tubular backing tube, wherein at least two ends of said at least two cylindrical target segments facing each other form a tongue-groove-fit with each other such that at least one tongue at one end is overlapped with at least one groove at a corresponding other end of said two adjacent cylindrical target segments, as viewed in the radial direction and/or the axial direction, an overlap extending at least along a part of a circumference of the corresponding end.

8. The sputtering target according to claim 1, wherein: said O-ring is directly compressed by said adjacent cylindrical target segment and by said stop member.

* * * * *